(12) United States Patent
Kondo (10) Patent No.: US 10,983,168 B2
(45) Date of Patent: Apr. 20, 2021

(54) METHODS AND APPARATUS FOR REPORTING A RELATIVE STATE OF CHARGE OF A BATTERY

(71) Applicant: SEMICONDUCTOR COMPONENTS INDUSTRIES, LLC, Phoenix, AZ (US)

(72) Inventor: Hideo Kondo, Ora-gun (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 56 days.

(21) Appl. No.: 16/217,702

(22) Filed: Dec. 12, 2018

(65) Prior Publication Data
US 2019/0120911 A1  Apr. 25, 2019

Related U.S. Application Data

(63) Continuation-in-part of application No. 15/355,577, filed on Nov. 18, 2016, now Pat. No. 10,184,987.

(51) Int. Cl.
*G01R 31/382* (2019.01)
*G01R 31/367* (2019.01)
(Continued)

(52) U.S. Cl.
CPC ......... *G01R 31/382* (2019.01); *G01R 31/367* (2019.01); *H01M 10/0525* (2013.01); *H01M 10/425* (2013.01); *H01M 10/4285* (2013.01); *H01M 10/48* (2013.01); *H01M 10/486* (2013.01); *H02J 7/007* (2013.01);
(Continued)

(58) Field of Classification Search
CPC .. G01R 31/382; G01R 31/367; G01R 31/374; H01M 10/425; H01M 10/4285; H01M 10/0525; H01M 10/486; H01M 10/48; H01M 2010/4271; H01M 2220/30; H02J 7/0047; H02J 7/007; H02J 7/0048
See application file for complete search history.

(56) References Cited

U.S. PATENT DOCUMENTS

2006/0261782 A1    11/2006  Kim
2011/0257915 A1*   10/2011  Yamamoto ............. B60L 58/12
                                                           702/63
(Continued)

FOREIGN PATENT DOCUMENTS

JP    2000287378    10/2000
JP    2001006757    1/2001
(Continued)

*Primary Examiner* — Tung X Nguyen
*Assistant Examiner* — Feba Pothen
(74) *Attorney, Agent, or Firm* — The Noblitt Group, PLLC; Hettie L. Haines (57) ABSTRACT

Various embodiments of the present technology may comprise methods and apparatus to determine an RSOC value of a battery. The methods and apparatus may comprise utilizing various parameters, such as voltage and/or current, to calculate the RSOC of the battery. In various embodiments, the methods and apparatus may display one of a first RSOC and a second RSOC. In various embodiments, the methods and apparatus may further detect changes in the relevant parameter(s), adjust the reported RSOC of the battery accordingly, and report the adjusted RSOC.

17 Claims, 9 Drawing Sheets

(51) Int. Cl.
*H01M 10/48* (2006.01)
*H01M 10/42* (2006.01)
*H02J 7/00* (2006.01)
*H01M 10/0525* (2010.01)
*G01R 31/374* (2019.01)

(52) U.S. Cl.
CPC .......... *H02J 7/0047* (2013.01); *G01R 31/374* (2019.01); *H01M 2010/4271* (2013.01); *H01M 2220/30* (2013.01); *H02J 7/0048* (2020.01)

(56) References Cited

U.S. PATENT DOCUMENTS

| | | |
|---|---|---|
| 2012/0290235 A1 | 11/2012 | Schaefer |
| 2013/0103333 A1 | 4/2013 | Nishida |
| 2014/0055100 A1 | 2/2014 | Igarashi |
| 2014/0218041 A1 | 8/2014 | Cho |
| 2014/0379188 A1 | 12/2014 | Uesaka |
| 2015/0171642 A1 | 6/2015 | Kato |
| 2016/0109529 A1* | 4/2016 | Meacham ............. H02J 7/0047 702/63 |
| 2016/0259012 A1* | 9/2016 | Sejima ............... G01R 31/3842 |
| 2016/0306013 A1 | 10/2016 | Kondo |
| 2017/0028867 A1* | 2/2017 | Ishishita ................. H02J 7/007 |

FOREIGN PATENT DOCUMENTS

| | | |
|---|---|---|
| JP | 2002260744 | 9/2002 |
| JP | 2004226393 | 8/2004 |
| JP | 2006-267014 | 10/2006 |

\* cited by examiner

METHODS AND APPARATUS FOR REPORTING A RELATIVE STATE OF CHARGE OF A BATTERY

CROSS-REFERENCE TO RELATED APPLICATION

This application is a continuation-in-part of U.S. patent application Ser. No. 15/355,577, filed on Nov. 18, 2016.

BACKGROUND OF THE TECHNOLOGY

"Battery capacity" is a measure (typically in ampere hours) of the charge stored by the battery, and is determined by the mass of active material contained in the battery. The battery capacity represents the maximum amount of energy that can be extracted from the battery under certain specified conditions. The available capacity of the battery may be referred to as the relative state of charge (RSOC). Typically expressed as a percentage, RSOC is the ratio of the remaining capacity to the full charge capacity (FCC).

Figure 4:
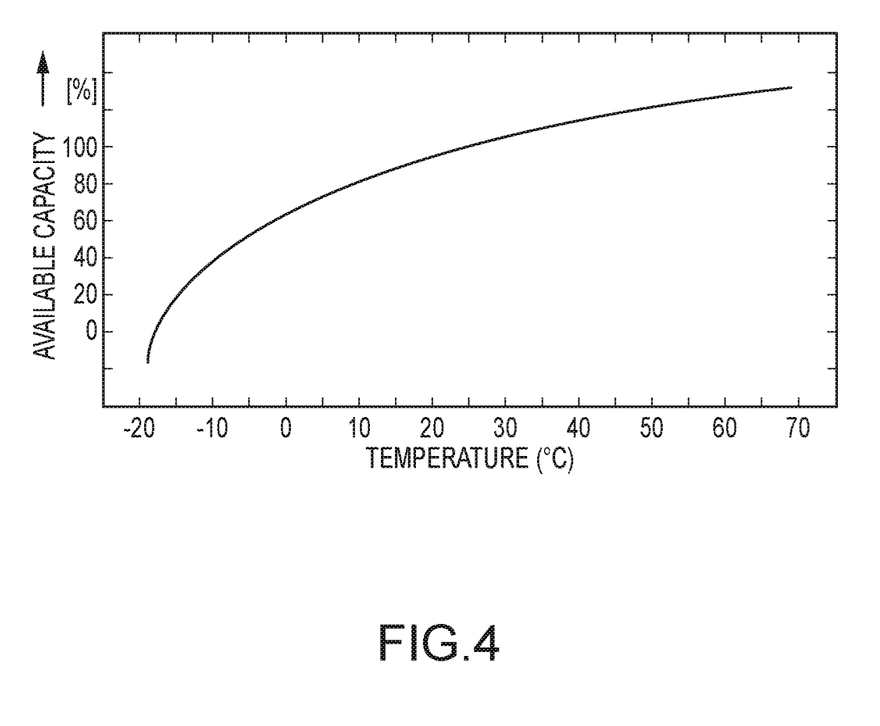
FIG. 4 is a graph indicating a relationship between available capacity and temperature of a battery in accordance with an exemplary embodiment of the present technology.

Temperature affects the full charge capacity of the battery. Referring to FIG. 4, in general, as the temperature decreases, the capacity decreases, and vice versa. Since the RSOC is computed based on the capacity value, the RSCO also increases or decreases according to temperature. The effect of temperature on the battery capacity results in inaccurate reporting of the RSOC.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various temperature sensors, processing units, computations, algorithms, and the like, which may carry out a variety of functions. In addition, the present technology may be practiced in conjunction with any number of systems, such as automotive systems, emergency charging system, and systems employed in consumer electronics and consumer wearables, and the systems described are merely exemplary applications for the technology. Further, the present technology may employ any number of conventional techniques for measuring voltages, currents, temperatures, supplying power, consuming power, controlling power delivery, and the like.

Figure 1:
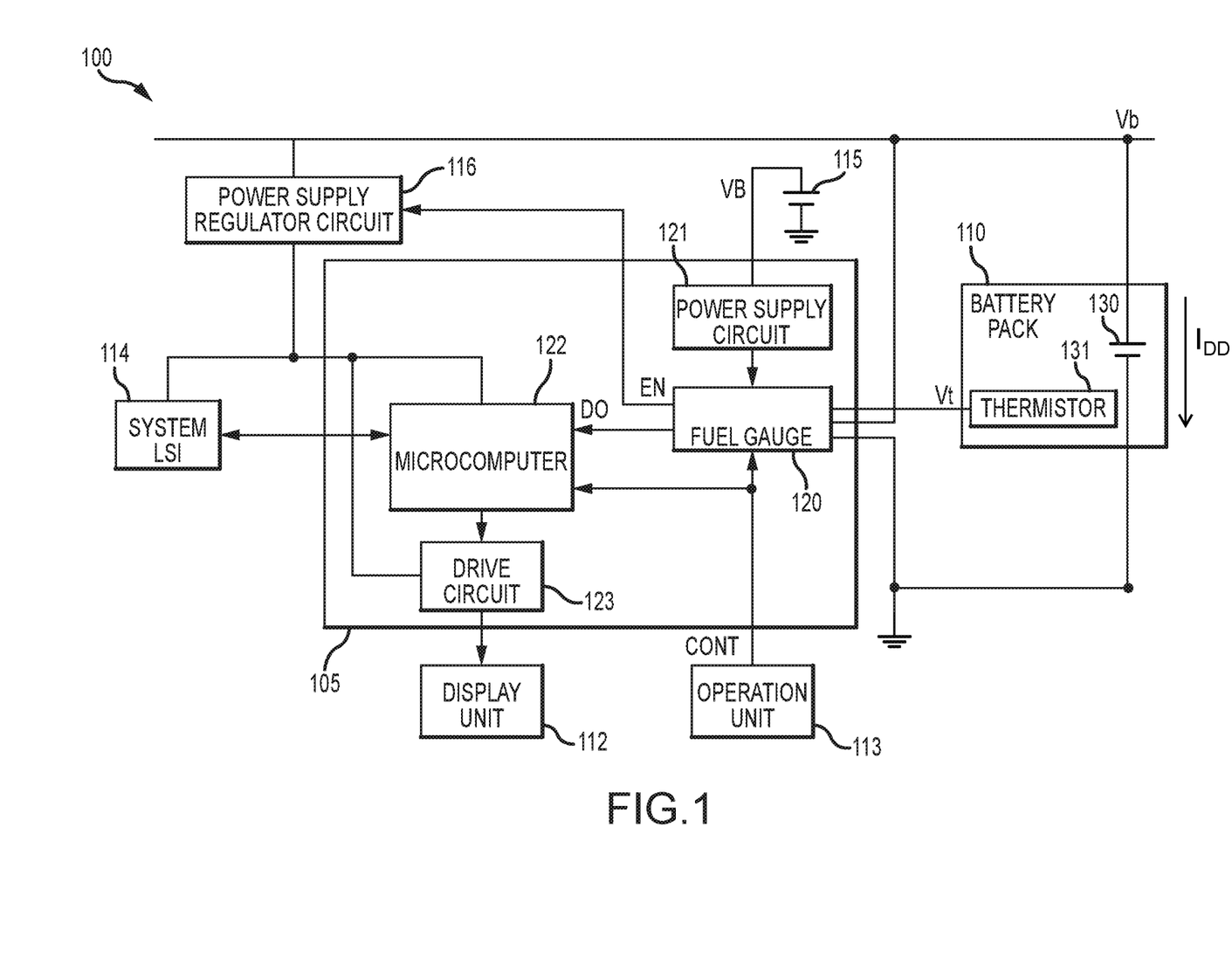
FIG. 1 representatively illustrates a block diagram of a battery system 100 in accordance with an exemplary embodiment of the present technology.

Methods and apparatus for reporting a relative state of charge (RSOC) of a battery according to various aspects of the present technology may operate in conjunction with any suitable battery-operated apparatus. For example, the apparatus may comprise a cellular phone, a computer, a tablet, or a camera. Referring to FIG. 1, in an exemplary embodiment of the present technology, methods and apparatus for reporting the relative state of charge for a battery may operate in conjunction with a system 100, such as a cellular phone or other communication system, including a battery monitoring system 105, a battery pack 110, a display unit 112, a power supply regulator circuit 116, a system LSI (Large Scale Integration) circuit 114, and an operation unit 113. According to various embodiments, the system 100 may also comprise other elements, such as a secondary battery 115 to operate a real-time clock circuit (not shown) and/or to update time of the cellular phone when the cellular phone is turned off.

The battery pack 110 provides power to the system 100, such as a power supply for the cellular phone to be operated. The battery pack 110 may comprise one or more batteries 130, such as a chargeable lithium ion battery, and a temperature sensor to sense the temperature of the battery 130. The temperature sensor may comprise any suitable device for measuring the battery temperature. In the present embodiment, the temperature sensor comprises a thermistor 131 that generates a voltage $V_t$ which corresponds to a temperature of the battery 130. The temperature sensor may, however, comprise any appropriate sensor or other device or system for generating a signal corresponding to the temperature of the battery 130.

The system 100 may comprise various other circuits, elements, and systems to perform other functions. For example, the phone of the present embodiment may comprise a display unit 112, wherein the display unit 112 may comprise a display screen, such as a liquid crystal panel, provided in the cellular phone to display characters, images, and the like, and associated circuits to control the display.

The system 100 may further comprise an operation unit 113 for a user to control the device. For example, the operation unit may comprise any suitable interface to receive input from the user, such as a keypad including a dial key, a power key, and the like (not shown). To operate the cellular phone, the operation unit 113 may output a control signal CONT. For example, if a user manipulates the power key in the operation unit 113 to start the cellular phone, an appropriate control signal CONT to start the cellular phone is outputted from the operation unit 113.

In various embodiments, the system 100 may further comprise the system large-scale integration (LSI) circuit 114 configured to realize various functions, for example communication in the cellular phone. The LSI circuit 114 may comprise any suitable system for the particular device or application, such as cell phone communication circuits, programmable logic devices, memory devices, and the like.

In the present embodiment, the LSI circuit 114 comprises a large scale integration circuit to realize various functions, for example communication in the cellular phone.

In various embodiments, the system 100 may further comprise a power supply regulator circuit 116 to generate one or more power supply voltages for powering the various elements of the device. For example, the power supply regulator circuit 116 may power the LSI circuit 114 and other system elements based on the output voltage $V_b$ of the battery 130 and/or power from an external power source. The power supply regulator circuit 116 may comprise a conventional power supply regulation system for providing appropriate voltages for the various elements.

The battery analysis circuit 105 determines the relative state of charge (i.e., remaining capacity) of the battery 130, and may do so according to any appropriate factors, including but not limited to the battery's age, internal resistance, current, voltage, temperature, and/or effective battery capacity. The battery monitoring system 105 may comprise any suitable components for determining the battery's 130 relative state of charge. For example, the battery monitoring system 105 may include a microcomputer 122, a drive circuit 123, a third power supply circuit 121, and a fuel gauge system 120.

The microcomputer 122 may control the cellular phone, for example based on the control data CONT received from the operation unit 113. Further, the microcomputer 122 may transfer data DO outputted from the fuel gauge system 120 to the drive circuit 123 configured to drive the display unit 112. The drive circuit 123 may drive the display unit 112 so that the remaining capacity, the temperature of the battery 30, and the like, can be displayed on the display unit 112 based on the data DO from the microcomputer 122. The third power supply circuit 121 may to generate a power supply voltage to operate the fuel gauge system 120, such as from the secondary battery 115. In various embodiments, the system 100 may further comprise a timing unit (not shown) to operate various circuits according to a predetermined timing cycle.

The fuel gauge system 120 responds to signals from the battery 130 and generates signals accordingly, for example to provide an indication of the remaining battery capacity on the display unit 112. The fuel gauge system 120 may comprise any suitable system, such as a large-scale integration (LSI). For example, referring to FIG. 2, the fuel gauge system 120 receives information from the battery pack 110 to analyze various functions and operational modes of the battery 130. According to various embodiments, the fuel gauge system 120 may communicate with other integrated circuits within the system 100, for example, the system LSI 114 and/or the display unit 112.

Figure 2:
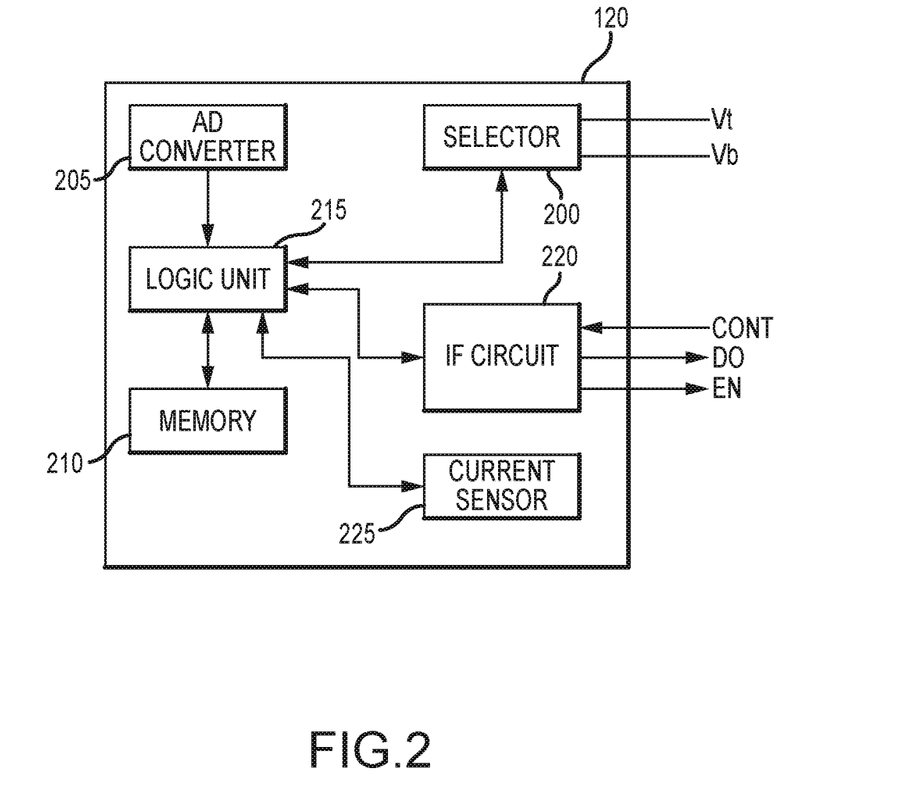
FIG. 2 representatively illustrates a block diagram of a fuel gauge system in accordance with an exemplary embodiment of the present technology.

The fuel gauge system 120 may comprise any appropriate components for receiving signals from the battery and calculating and reporting the relative state of charge for the battery 130. For example, the fuel gauge system 120 of the present embodiment includes a logic unit 215 to receive the signals and calculate the relative state of charge for the battery 130. The fuel gauge system 120 may also include a memory 210 to store information generated by and/or used by the logic unit 215. The fuel gauge system 120 may further include various elements to generate and/or transfer signals, such as a selector 200, an analog-to-digital converter (ADC) 205, an interface (IF) circuit 220, and a current sensor 225.

The fuel gauge system 120 may be configured to receive multiple signals from the battery pack 110, such as the output voltage of the battery 130 and/or the temperature signal from the temperature sensor. In various embodiments, the selector 200 selectively transmits signals from the battery pack 130. The selector 200 may comprise any suitable circuit to receive the output voltage $V_b$ and/or voltage $V_t$, such as a multiplexer controlled by the logic unit 210.

The fuel gauge system 120 may further include the ADC 205, if appropriate, to convert the output voltage $V_b$ and thermistor voltage $V_t$ provided via the selector 200 into a digital voltage value for use by the logic unit 215. The ADC 205 may comprise any suitable analog-to-digital architecture, and may be selected based on a particular application.

The fuel gauge system 120 may be configured to interact with other elements of the system 100, such as to receive power and receive and transmit control signals and data. In the present embodiment, the fuel gauge system 120 includes the IF circuit 220 to facilitate the exchange of signals, such as between the logic unit 215 and the operation unit 113, the power supply regulator circuit 116, and the microcomputer 122. The fuel gauge system 120 may be configured in any suitable manner, however, to facilitate interaction with the other elements of the system 100.

The current sensor 225 may sense current through the battery 110. For example, the current sensor 225 may detect a direction of a current $I_{DD}$ flow, wherein the direction of the current $I_{DD}$ flow may indicate whether the battery 130 is in a charge state or a discharge state. The current sensor 225 may also sense the magnitude of the current flow. The current sensor 225 may comprise any suitable circuit or device for detecting the direction, and possibly magnitude, of the current $I_{DD}$ flow and provide corresponding signals to the logic unit 215.

The logic unit 215 may control the fuel gauge system 120 in response to input signals and generate corresponding output signals, such as the relative state of charge for a battery. The logic unit 215 may comprise any suitable analog or digital system, such as a hard-wired logical circuit configured to automatically respond to the input signals with the appropriate output signals. In the present embodiment, the logic unit 215 comprises a circuit that may execute various operations and/or realize various functions by executing one or more programs. The logic unit 215 may perform various calculations, perform decision-making functions, and/or transmit various control functions. The logic unit 215 may also receive information regarding various measured data, such as temperature data, as well as reference data stored in the memory 210.

The memory 210 stores information to be used by the fuel gauge system 120, such as programs and data. The memory may comprise any appropriate types of memory, and may store any suitable information. For example, referring to FIG. 3, in various embodiments, the memory 210 may comprise a circuit to store programs executed by the logic unit 215 and various types of data. In an exemplary embodiment, the memory 210 may comprise ROM (read only memory) and RAM (random access memory). The storage area of the memory 210 may comprise a program storage unit 300 to store various programs to operate the logic unit 215.

Figure 3:
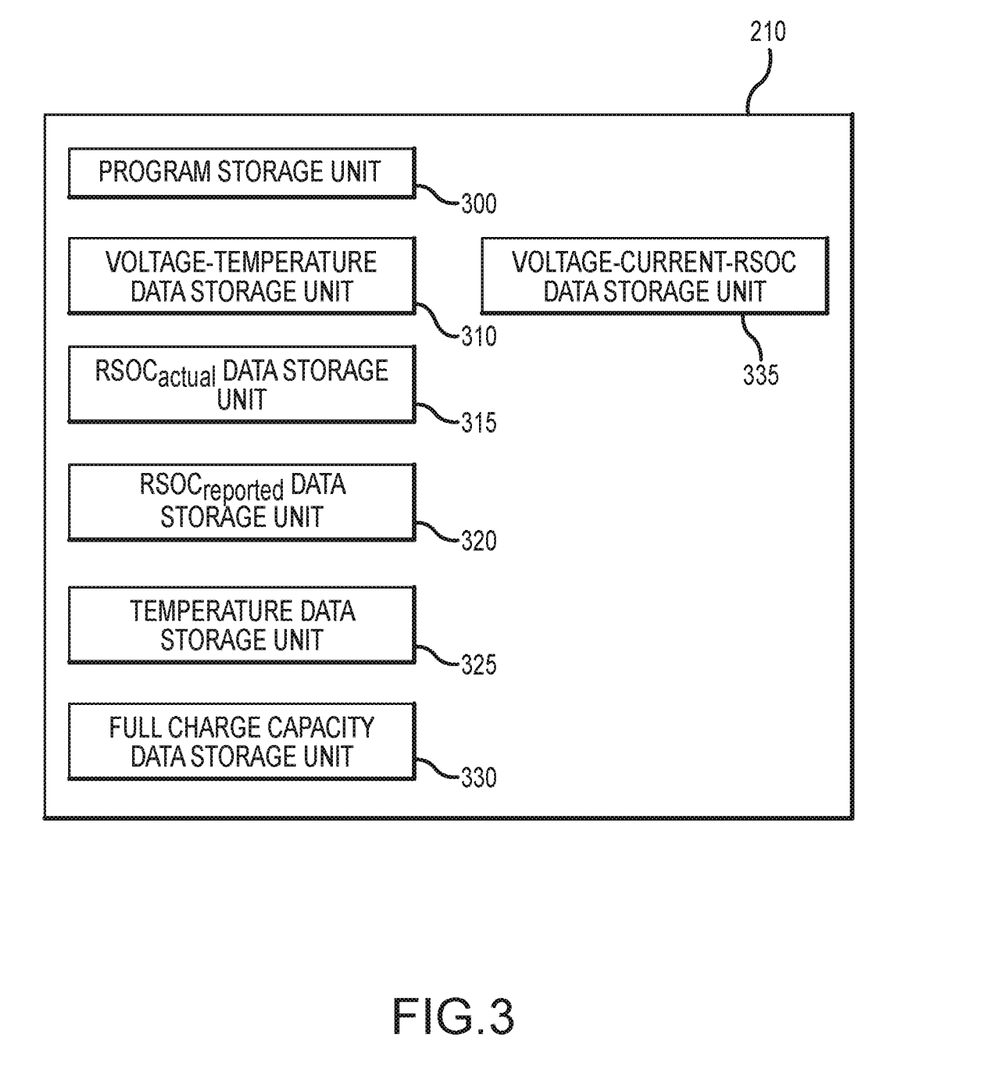
FIG. 3 is a block diagram of a memory unit in accordance with an exemplary embodiment of the present technology.

In an exemplary embodiment, the memory 210 may comprise various data storage units to store data calculated and/or measured by the fuel gauge system 120. For example, the memory 210 may comprise a first data storage unit 315 to store an actual RSOC value ($RSOC_{actual}$), a second data storage unit 320 to store a reported RSOC value ($RSOC_{reported}$), and a third data storage unit 325 to store temperature data.

The memory 210 may further comprise battery reference data. For example, the memory 210 may comprise an FCC data storage unit 330 that contains data relating to the FCC value of the battery. The FCC data storage unit 330 may comprise any suitable circuit or device for storing data.

The memory 210 may further comprise a voltage-temperature data storage unit 310 to store data indicating the relationship between the thermistor voltage $V_t$ and the temperature. In the present embodiment, and referring again to FIG. 4, the voltage-temperature data storage unit 310 may comprise a look-up table storing information corresponding to the relationship between the temperature and the capacity.

Figure 5:
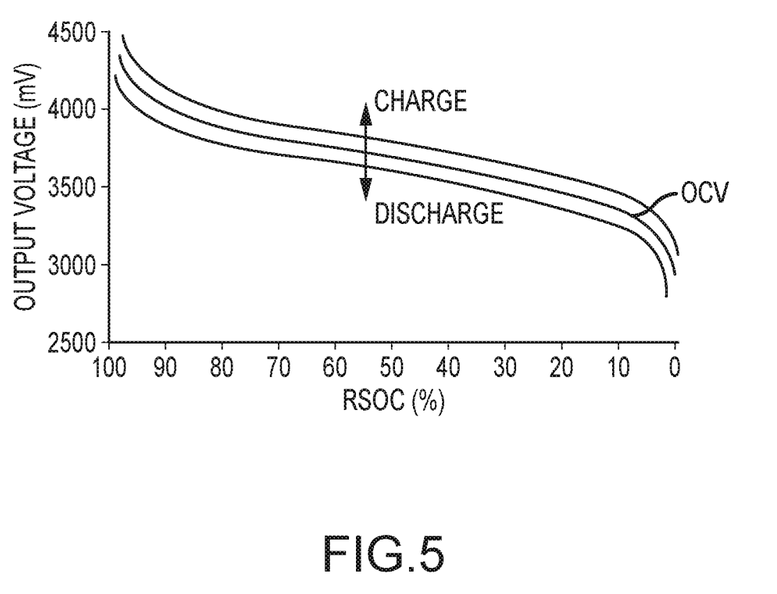
FIG. 5 is a graph indicating a relationship between voltage, current, and remaining capacity of a battery in accordance with an exemplary embodiment of the present technology.

The memory 210 may further comprise a voltage-current-RSOC data storage unit 335 to store data that describes the relationship between the output voltage $V_b$, current $I_{DD}$, and the RSOC, such as the relationship illustrated in FIG. 5. The data may be stored as a look-up table. The voltage-current-RSOC data storage unit 335 may comprise open circuit voltage (OCV) characteristics at a specified temperature, for example 20 degrees Celsius. When graphed, the OCV characteristics may be referred to as an OCV curve. For a particular output voltage $V_b$, if the battery 130 is charging, the voltage-RSOC curve may increase relative to the OCV curve, or if the battery 130 is discharging, the voltage-RSOC curve may decrease relative to the OCV curve. The amount that the voltage-RSOC curve increases or decreases relative to the OCV curve depends, at least in part, on the magnitude of the current $I_{DD}$.

The battery monitoring system 105 may monitor the battery 130 charge and report the RSOC, for example via the display unit 112. The battery monitoring system 105 may further adjust the RSOC reported to the user if the actual results are confusing or misleading, even if they are correct.

For example, the battery monitoring system 105 may monitor various conditions, such as conditions that relate to the battery pack 110 and the battery 130 capacity. In one embodiment, the battery monitoring system 105 monitors the battery 130 to determine the charging mode of the battery, i.e., whether the battery 130 is charging or discharging. The battery monitoring system 105 may also monitor a direction of change of the temperature of the battery 130, i.e., whether the temperature is rising or falling. If the battery 130 is charging and the temperature of the battery is increasing, the RSOC may actually drop because the capacity of the battery increases with temperature. Thus, even though the battery 130 is charging, the RSOC decreases, which can be confusing to the user. Conversely, if the battery 130 is discharging and the temperature of the battery is decreasing, the RSOC may actually increase because the capacity of the battery 130 decreases with temperature. Thus, even though the battery 130 is discharging, the RSOC increases, which can likewise confuse the user.

The battery monitoring system 105 may adjust the RSOC reported to the user, for example according to the temperature and charging conditions. If (1) the battery 130 is charging and the battery 130 temperature is rising, or (2) the battery 130 is discharging and the battery 130 temperature is falling, the battery monitoring system 105 may adjust the reported RSOC. For example, the battery monitoring system 105 may suspend updating the RSOC and instead provide the most recently measured RSOC to the user.

The battery monitoring system 105 may further monitor the battery 130 conditions for appropriate conditions to resume updating the RSOC. For example, the battery monitoring system 105 may monitor the battery pack 110 for a mode change, i.e., switching from charging to discharging or vice versa. When a mode change occurs, the battery monitoring system 105 may determine the actual RSOC and compare it to the reported RSOC. When the actual RSOC returns to the level of the reported RSOC, the battery monitoring system 105 may continue reporting the actual RSOC to the user.

The battery monitoring system 105 may adjust the reported RSOC according to suitable criteria and according to any appropriate process. For example, referring to FIGS. 6-7, the exemplary fuel gauge system 120 of the present embodiment may perform various calculations and various measurements to determine the RSOC. In various embodiments, the fuel gauge system 120 may display one of two RSOC values based on the temperature and charge/discharge state of the battery 130.

Figure 6A:
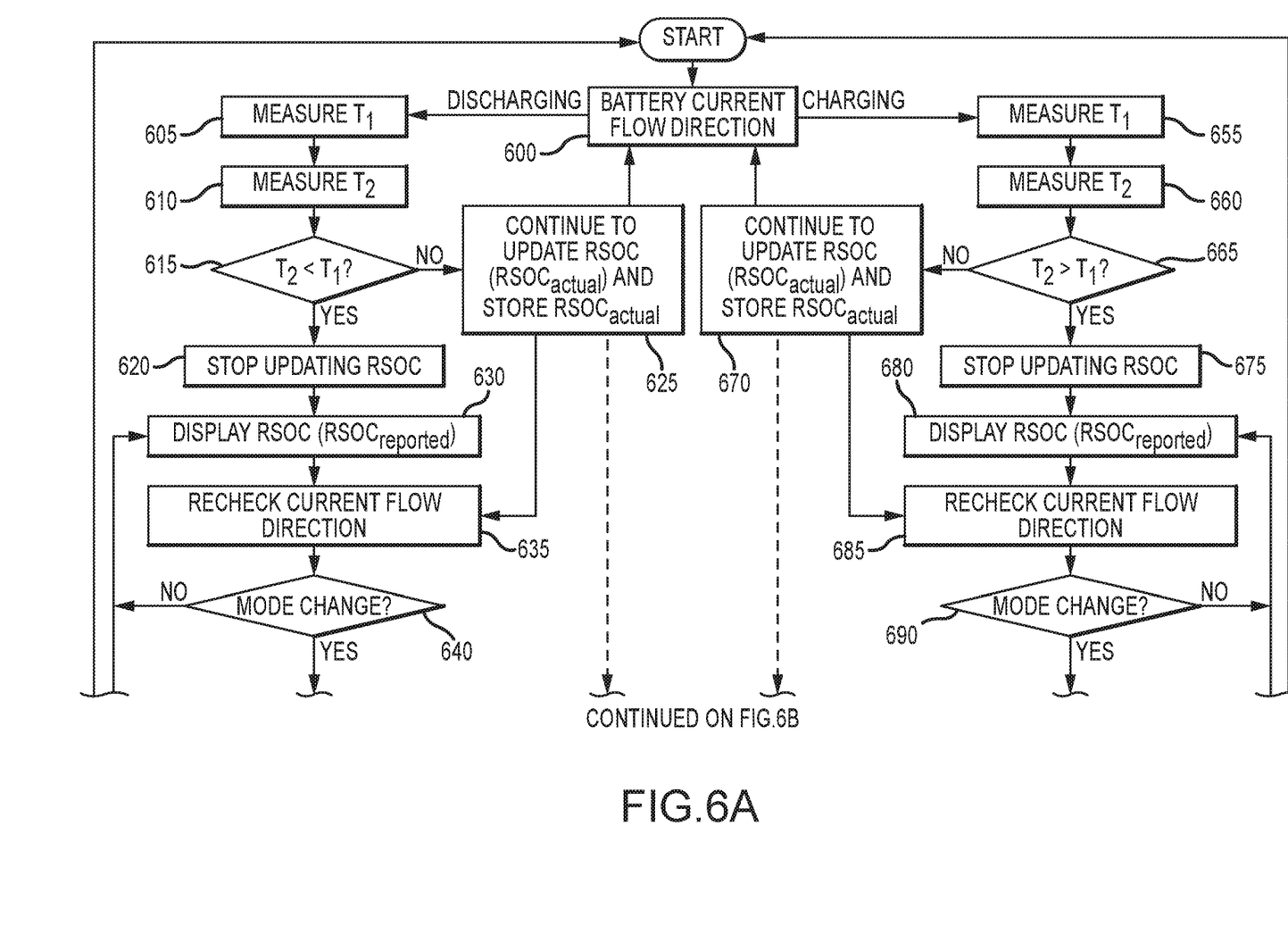
FIGS. 6A-6B are a flow chart for reporting an RSOC in accordance with an exemplary embodiment of the present technology.
Figure 6B:
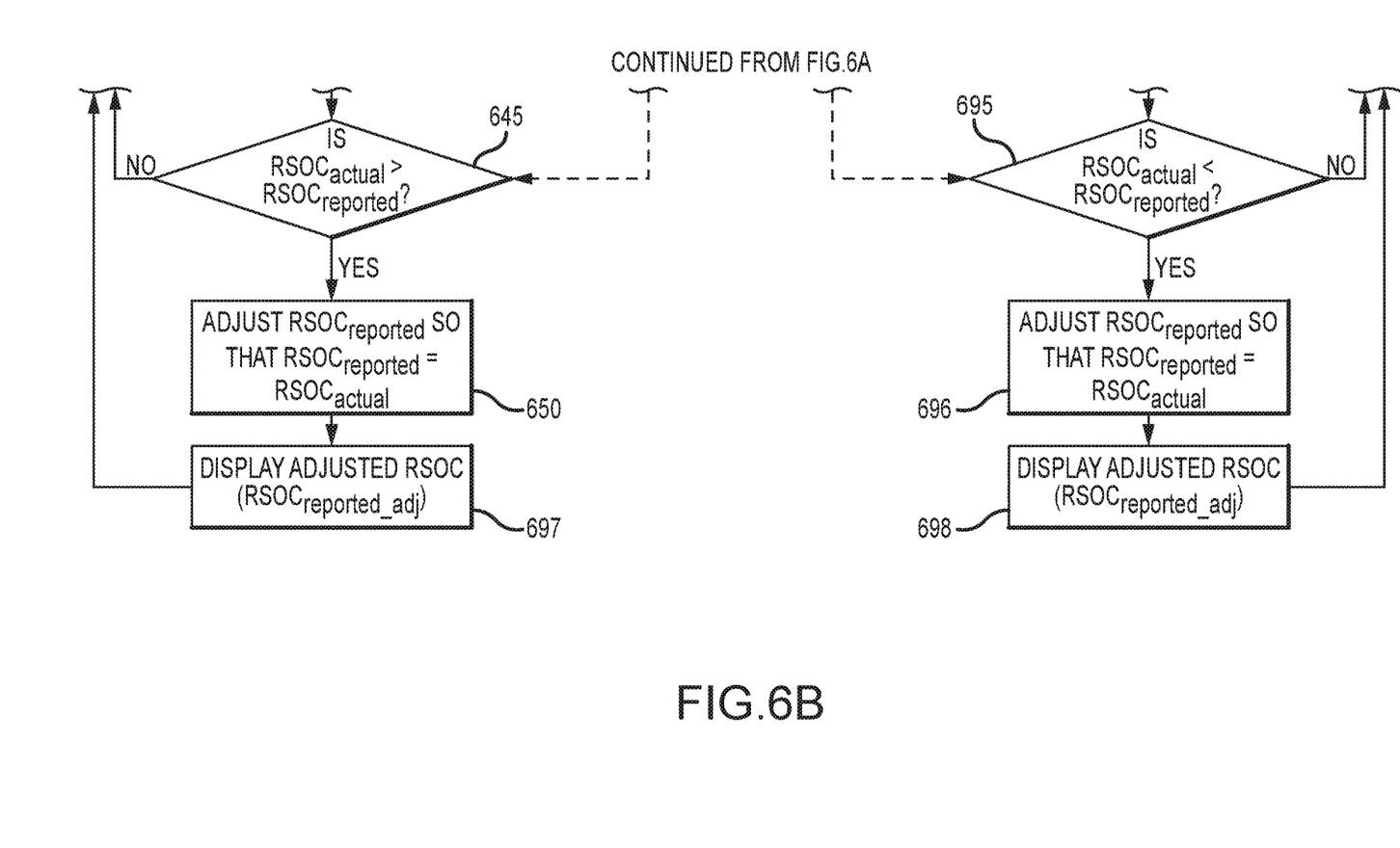

Referring to FIGS. 6A-6B, in a first operation, the current sensor 225 may determine whether the battery 130 is charging (i.e., the charge state) or discharging (i.e., the discharge state). For example, the current sensor 225 may comprise a device to detect the direction of the current flow. In other embodiments, the direction of the current $I_{DD}$ flow may be determined by measuring the output voltage $V_b$ and utilizing the OCV curve, to determine whether the output voltage $V_b$ increased or decreased relative to the OCV curve. If the output voltage $V_b$ decreases relative to the OCV curve, then the battery 130 is discharging, and if the output voltage increases relative to the OCV curve, then the battery 130 is charging.

In an exemplary embodiment, if the battery 130 is discharging, then the fuel gauge system 120 may measure a first temperature $T_1$ (605). For example, the selector 200 may receive the thermistor voltage $V_t$ from the thermistor 131 and the AD converter 205 may convert the thermistor voltage $V_t$ to a digital value. A digital value representing the thermistor voltage $V_t$ may be transmitted to the logic unit 215 and stored in the memory 210. The temperature-voltage data storage unit 335 may convert the thermistor voltage $V_t$ to the first temperature $T_1$, measured in degrees Celsius. The first temperature $T_1$ may be stored in the temperature data storage unit 325.

The fuel gauge system 120 may then obtain a second temperature $T_2$ (610) after a predetermined time. The fuel gauge system 120 may obtain the second temperature $T_2$ in the same manner as the first temperature $T_1$.

The logic unit 215 may utilize the first and second temperatures $T_1$, $T_2$ stored in memory 210 to determine if the second temperature $T_2$ is less than the first temperature $T_1$ (i.e., $T_2<T_1$?) (615). If the second temperature $T_2$ is not less than the first temperature $T_1$, then the fuel gauge system 120 may continue to update the RSOC based on any suitable method for calculating the RSOC (625) and re-measure the battery flow direction (600). The computed RSOC value may be referred to as the actual RSOC ($RSOC_{actual}$), and the fuel gauge system 120 may store the actual RSOC value in the memory 210, for example in the $RSOC_{actual}$ data storage unit 315. The system 100 may display (i.e., report to the user) the actual RSOC on the display unit 112.

If the second temperature $T_2$ is less than the first temperature $T_1$, then the fuel gauge system 120 may stop updating the RSOC value (620). The system 100 may display (i.e., report to the user) the value of the RSOC, at the time when the logic unit 215 stops updating the RSOC, for example on the display unit 112 (630). The displayed RSOC value may be referred to as the reported RSOC ($RSOC_{reported}$), and the fuel gauge system 120 may store the reported RSOC value in the memory 210, for example in the $RSOC_{reported}$ data storage unit 320.

The fuel gauge system 120 may then recheck the direction of the current IDD flow (635) to determine if a mode change has occurred (640). In this case, if a mode change has occurred, the current sense 225 may detect that the battery 130 is now charging. If the fuel gauge system 120 does not detect a mode change, then the system may continue to display the reported RSOC value (RSOC$_{reported}$). If the fuel gauge system 120 detects a mode change, then the logic unit 215 may determine whether the actual RSOC value is greater than the reported RSOC value (i.e., RSOC$_{actual}$>RSOC$_{reported}$?) (645).

If the actual RSOC (RSOC$_{actual}$) value is not greater than the reported RSOC value (RSOC$_{reported}$), then the display unit 112 may continue to display the reported RSOC value (RSOC$_{reported}$) (630). If the actual RSOC value (RSOC$_{actual}$) is greater than the reported RSOC value, then the fuel gauge system 120 may adjust the reported RSOC (RSOC$_{reported}$) so that the reported RSOC (RSOC$_{reported}$) is equal to the actual RSOC value (i.e., RSOC$_{reported\_adj}$=RSOC$_{actual}$) (650). In various embodiments, the reported RSOC may be adjusted in increments according to a computed impedance value and other suitable variables. The system 100 may display the adjusted RSOC (RSOC$_{reported\_adj}$) on the display unit 112 (697). In various embodiments, if the reported RSOC is adjusted incrementally, the displayed RSOC (RSOC$_{reported\_adj}$) may also change incrementally. The fuel gauge system 120 may then recheck the direction of the current I$_{DD}$ flow (600).

Alternatively, if the current sensor 225 initially determines that the battery 130 is charging, then the fuel gauge system 120 may measure the thermistor voltage V$_t$ and obtain a first temperature T$_1$ (655) and a second temperature T$_2$ (660) in the same manner as described above, and stored in the memory 210, for example in the temperature data storage unit 325.

The logic unit 215 may utilize the first and second temperatures T$_1$, T$_2$ stored in memory 210 to determine if the second temperature T$_2$ is greater than the first temperature T$_1$ (i.e., T$_2$>T$_1$?) (665). If the second temperature T$_2$ is not greater than the first temperature T$_1$, then the fuel gauge system 120 may continue to update the RSOC based on any suitable method for calculating the RSOC (670) and re-measure the direction of the current flow (600). The RSOC value obtained may be referred to as the actual RSOC (RSOC$_{actual}$) and the fuel gauge system 120 may store the actual RSOC value in the memory 210, for example in the RSOC$_{actual}$ data storage unit 315. The system 100 may display (i.e., report to the user) the actual RSOC (RSOC$_{actual}$) on the display unit 112.

If the second temperature T$_2$ is greater than the first temperature T$_1$, then the fuel gauge system 120 may stop updating the RSOC value (675). The system may display the value of the RSOC, at the time when the logic unit 215 stops updating the RSOC, for example on the display unit 112 (680). The displayed RSOC value may be referred to as the reported RSOC (RSOC$_{reported}$), and the fuel gauge system 120 may store the reported RSOC value in the memory 210, for example in the RSOC$_{reported}$ data storage unit 320.

The fuel gauge system 120 may then recheck the direction of the current I$_{DD}$ flow (685) to determine if a mode change has occurred (690). In this case, if a mode change has occurred, the current sensor 225 may detect that the battery 130 is now discharging. If the fuel gauge system 120 does not detect a mode change, then the system may continue to display the reported RSOC value. If the fuel gauge system 120 detects a mode change, then the logic unit 215 may determine whether the actual RSOC value is less than the reported RSOC value (i.e., RSOC$_{actual}$<RSOC$_{reported}$?) (695).

If the actual RSOC value is not less than the reported RSOC value, then the display unit 112 may continue to display (i.e., report to the user) the reported RSOC value (680). If the actual RSOC value is less than the reported RSOC value, then the fuel gauge system 120 may adjust the reported RSOC (RSOC$_{reported}$) so that the reported RSOC (RSOC$_{reported}$) is equal to the actual RSOC value (i.e., RSOC$_{reported\_adj}$=RSOC$_{actual}$) (696). In various embodiments, the reported RSOC may be adjusted in increments according to a computed impedance value and other suitable variables. The system 100 may display (i.e., report to the user) the adjusted RSOC (RSOC$_{reported\_adj}$) on the display unit 112 (698). In various embodiments, if the reported RSOC is adjusted incrementally, the displayed RSOC (RSOC$_{reported\_adj}$) may also change incrementally. The fuel gauge system 120 may then recheck the direction of the current I$_{DD}$ flow (600).

Figure 7A:
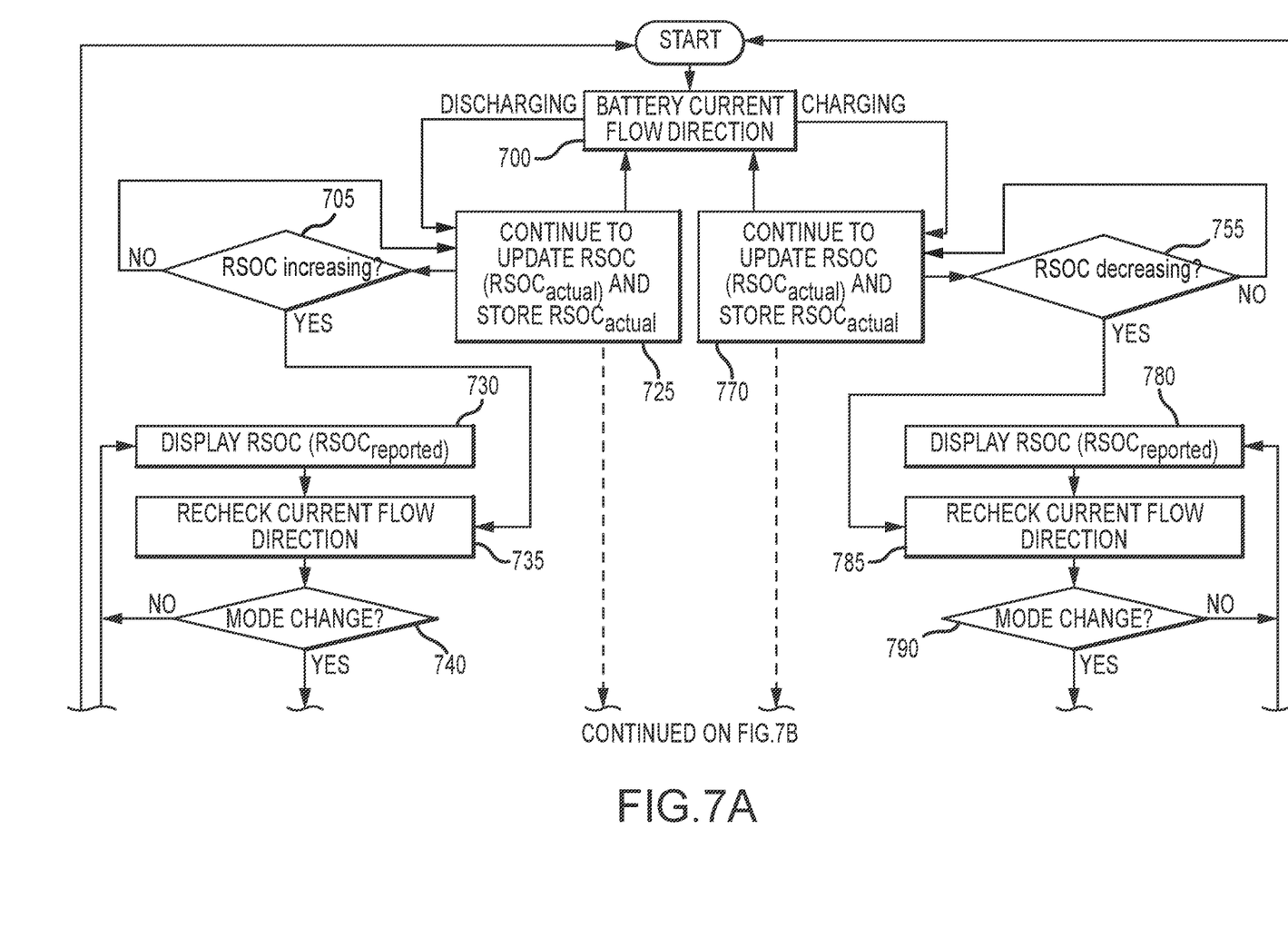
FIGS. 7A-7B are an alternative flow chart for reporting an RSOC an accordance the present technology.
Figure 7B:
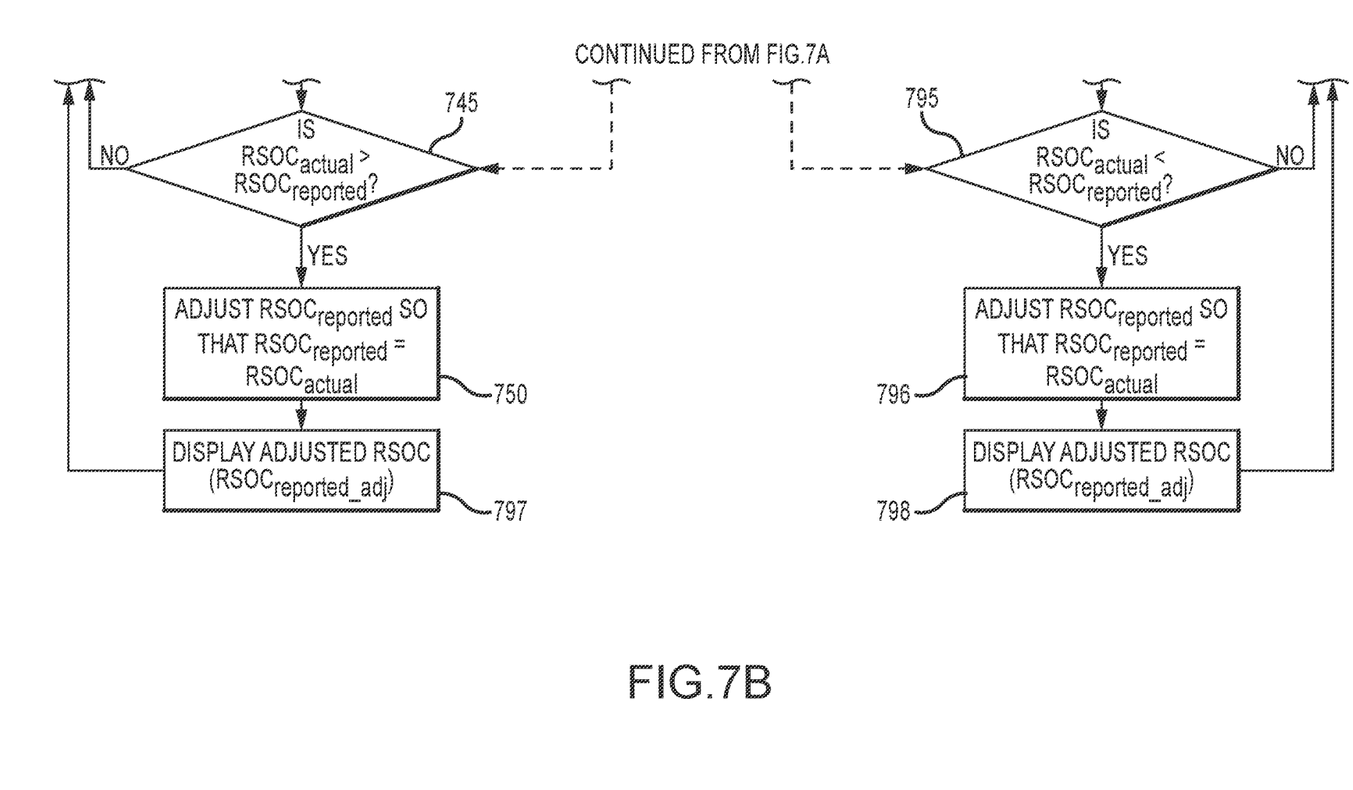

In an alternative operation, and referring to FIGS. 7A-7B, the current sensor 225 may determine whether the battery 130 is charging (i.e., the charge state) or discharging (i.e., the discharge state). For example, the current sensor 225 may comprise a device to detect the direction of the current flow. In other embodiments, the direction of the current I$_{DD}$ flow may be determined by measuring the output voltage V$_b$ and utilizing the OCV curve, to determine whether the output voltage V$_b$ increased or decreased relative to the OCV curve. If the output voltage V$_b$ decreases relative to the OCV curve, then the battery 130 is discharging, and if the output voltage increases relative to the OCV curve, then the battery 130 is charging.

If the battery 130 is discharging, the fuel gauge system 120 may continue to periodically measure the RSOC and store the values (725). The fuel gauge system 120 may then determine if the RSOC values have an upward trend (increasing over time) (705). If the RSOC values are not increasing, then the fuel gauge system 120 may continue to periodically measure and store the RSOC (725).

If the RSOC values are increasing, then the fuel gauge system 120 may then recheck the direction of the current IDD flow (735) to determine if a mode change has occurred (740). In this case, if a mode change has occurred, the current sense 225 may detect that the battery 130 is now charging. If the fuel gauge system 120 does not detect a mode change, then the system may continue to display the reported RSOC value (RSOC$_{reported}$). If the fuel gauge system 120 detects a mode change, then the logic unit 215 may determine whether the actual RSOC value is greater than the reported RSOC value (i.e., RSOC$_{actual}$>RSOC$_{reported}$?) (745).

If the actual RSOC (RSOC$_{actual}$) value is not greater than the reported RSOC value (RSOC$_{reported}$), then the display unit 112 may continue to display the reported RSOC value (RSOC$_{reported}$) (630). If the actual RSOC value (RSOC$_{actual}$) is greater than the reported RSOC value, then the fuel gauge system 120 may adjust the reported RSOC (RSOC$_{reported}$) so that the reported RSOC (RSOC$_{reported}$) is equal to the actual RSOC value (i.e., RSOC$_{reported\_adj}$=RSOC$_{actual}$) (650). In various embodiments, the reported RSOC may be adjusted in increments according to a computed impedance value and other suitable variables. The system 100 may display the adjusted RSOC (RSOC$_{reported\_adj}$) on the display unit 112 (697). In various embodiments, if the reported RSOC is adjusted incrementally, the displayed RSOC (RSOC$_{reported\_adj}$) may also change incrementally. The fuel gauge system 120 may then recheck the direction of the current I$_{DD}$ flow (600).

Alternatively, if the current sensor 225 initially determines that the battery 130 is charging, then the fuel gauge system 120 may continue to periodically measure the RSOC and store the values (770). The fuel gauge system 120 may then determine if the RSOC values have a downward trend (decreasing over time) (755). If the RSOC values are not decreasing, then the fuel gauge system 120 may continue to periodically measure and store the RSOC (770).

If the RSOC values are decreasing, the fuel gauge system 120 may then recheck the direction of the current $I_{DD}$ flow (785) to determine if a mode change has occurred (790). In this case, if a mode change has occurred, the current sensor 225 may detect that the battery 130 is now discharging. If the fuel gauge system 120 does not detect a mode change, then the system may continue to display the reported RSOC value. If the fuel gauge system 120 detects a mode change, then the logic unit 215 may determine whether the actual RSOC value is less than the reported RSOC value (i.e., $RSOC_{actual} < RSOC_{reported}$?) (795).

If the actual RSOC value is not less than the reported RSOC value, then the display unit 112 may continue to display (i.e., report to the user) the reported RSOC value (780). If the actual RSOC value is less than the reported RSOC value, then the fuel gauge system 120 may adjust the reported RSOC ($RSOC_{reported}$) so that the reported RSOC ($RSOC_{reported}$) is equal to the actual RSOC value (i.e., $RSOC_{reported\_adj} = RSOC_{actual}$) (796). In various embodiments, the reported RSOC may be adjusted in increments according to a computed impedance value and other suitable variables. The system 100 may display (i.e., report to the user) the adjusted RSOC ($RSOC_{reported\_adj}$) on the display unit 112 (798). In various embodiments, if the reported RSOC is adjusted incrementally, the displayed RSOC ($RSOC_{reported\_adj}$) may also change incrementally. The fuel gauge system 120 may then recheck the direction of the current $I_{DD}$ flow (700).

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system 100 may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus for reporting an RSOC of a battery, comprising:
   a current sensor to measure a current through the battery and generate current data; and
   a logic unit configured to:
   receive the current data from the current sensor;
   determine a mode of operation of the battery according to the current data, wherein the mode of operation is one of a charging mode and a discharging mode;
   measure a first RSOC value;
   measure a second RSOC value;
   determine a trend based on the first RSOC value and the second RSOC value;
   determine whether a change in the mode of operation of the battery has occurred; and
   report at least one of the first RSOC value and the second RSOC value, wherein the logic unit reports the second RSOC if the mode of operation is the charging mode and the second RSOC is less than the first RSOC.

2. The apparatus of claim 1, wherein the trend is one of: increasing if the second RSOC is greater than the first RSOC; and decreasing if the second RSOC is less than the first RSOC.

3. The apparatus of claim 2, wherein the logic unit is further configured to reevaluate the current data if the trend is increasing and the mode of operation is the discharging mode.

4. The apparatus of claim 2, wherein the logic unit is further configured to reevaluate the current data if the trend is decreasing and the mode of operation is the charging mode.

5. The apparatus of claim 1, wherein determining whether the change in the mode of operation of the battery has occurred comprises evaluating the current data.

6. The apparatus of claim 1, wherein the logic unit is further configured to adjust at least one of the first and second RSOC values.

7. The apparatus of claim 1, wherein the logic unit is configured to adjust the second RSOC value to match the first RSOC value if the change in the mode of operation has occurred.

8. The apparatus of claim 1, wherein the logic unit reports the second RSOC if the mode of operation is the discharging mode and the second RSOC is greater than the first RSOC.

9. A method for reporting an RSOC value of a battery, comprising:
- determining a mode of operation of the battery according to a battery current, wherein the mode of operation of the battery is at least one of a charging mode and a discharging mode;
- computing a first RSOC value;
- computing a second RSOC value;
- determining a trend based on the first and second RSOC values;
- determining whether a change in the mode of operation has occurred; and
- reporting one of the first and second RSOC values according to the mode of operation, wherein the second RSOC is reported if the mode of operation is the charging mode and the second RSOC is less than the first RSOC.

10. The method of claim 9, further comprising reporting the second RSOC if the mode of operation is the discharging mode and the second RSOC is greater than the first RSOC.

11. The method of claim 9, further comprising adjusting the second RSOC value to match the first RSOC value if the change in the mode of operation has occurred.

12. The method of claim 9, wherein determining whether the change in the mode of the battery has occurred comprises revaluating the battery current.

13. A system for reporting an RSOC of a battery, comprising:
- a battery pack comprising the battery; and
- a fuel gauge system coupled to the battery pack, comprising:
  - a current sensor configured to generate current data;
  - a logic unit configured to:
    - determine a mode of operation of the battery, wherein the mode of operation of the battery is at least one of a charging mode and a discharging mode;
    - measure a first RSOC value;
    - measure a second RSOC value;
    - determine a trend based on the first RSOC value and the second RSOC value;
    - determine whether a change in the mode of operation of the battery has occurred; and
    - report one of the first and second RSOC values according to the mode of operation, wherein the logic unit reports the second RSOC if the mode of operation is the charging mode and the second RSOC is less than the first RSOC; and
- a display unit coupled to the fuel gauge system to display the reported RSOC.

14. The system of claim 13, wherein the logic unit is further configured to adjust the second RSOC based on whether the change in the mode of operation has occurred.

15. The system of claim 13, wherein the logic unit reports the second RSOC if the mode of operation is the discharging mode and the second RSOC is greater than the first RSOC.

16. The system of claim 13, wherein determining whether the change in the mode of operation of the battery has occurred comprises evaluating the current data.

17. The system of claim 13, wherein the logic unit is further configured to adjust the second RSOC value to match the first RSOC value if the change in the mode of operation has occurred.

* * * * *